(12) United States Patent
Tzeng et al.

(10) Patent No.: US 6,306,767 B1
(45) Date of Patent: Oct. 23, 2001

(54) SELF-ALIGNED ETCHING METHOD FOR FORMING HIGH AREAL DENSITY PATTERNED MICROELECTRONIC STRUCTURES

(75) Inventors: Kuo-Chyuan Tzeng; Tse-Liang Ying; Wen-Chuan Chiang, all of Hsin-Chu; Ming-Hsiang Chiang, Taipei, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/584,111

(22) Filed: May 31, 2000

(51) Int. Cl.$^7$ ...................... H01L 21/302; H01L 21/8242
(52) U.S. Cl. .......................... 438/689; 438/253; 438/239; 438/678; 438/700
(58) Field of Search ..................... 438/689, 678, 438/650, 253, 132, 239, 254, 396, 244, 700, 745

(56) References Cited

U.S. PATENT DOCUMENTS

| | | | |
|---|---|---|---|
| 5,100,826 | * 3/1992 | Dennison | 438/396 |
| 5,234,856 | * 8/1993 | Gonzalez | 438/244 |
| 5,266,512 | * 11/1993 | Kirsch | 438/253 |
| 5,364,813 | 11/1994 | Koh . | |
| 5,650,351 | 7/1997 | Wu . | |
| 5,789,320 | * 8/1998 | Andricacos et al. | 438/678 |
| 5,895,239 | * 4/1999 | Jeng et al. | 438/239 |
| 6,022,776 | 2/2000 | Lien et al. . | |
| 6,030,867 | 2/2000 | Chien et al. . | |
| 6,037,211 | 3/2000 | Jeng et al. . | |
| 6,124,165 | * 9/2000 | Lien | 438/253 |
| 6,184,081 | * 2/2001 | Jeng et al. | 438/253 |

* cited by examiner

Primary Examiner—Matthew Smith
Assistant Examiner—Igase W. Anya
(74) Attorney, Agent, or Firm—Tung & Associates

(57) ABSTRACT

Within a method for forming a patterned layer there is first provided a topographic substrate. There is then formed conformally over the topographic substrate a blanket target layer formed of a target material, where the blanket target layer has a lower substantially horizontal portion, an upper substantially horizontal portion and an intermediate portion therebetween. There is then formed upon the lower substantially horizontal portion of the blanket target layer a first masking layer formed of a first masking material and formed upon the upper substantially horizontal portion of the blanket target layer a second masking layer formed of a second masking material. There is then etched, while employing an etch method having an enhanced sequential selectivity for the first masking material and the target material with respect to the second masking material, the first masking layer and the lower substantially horizontal portion of the blanket target layer to form a patterned target layer which leaves exposed a portion of the substrate beneath the lower horizontal portion of the blanket target layer while leaving unetched the upper substantially horizontal portion of the blanket target layer. The method is particularly useful for forming patterned capacitor plate layers.

17 Claims, 4 Drawing Sheets

SELF-ALIGNED ETCHING METHOD FOR FORMING HIGH AREAL DENSITY PATTERNED MICROELECTRONIC STRUCTURES

BACKGROUND OF THE INVENTION

1. Field of the Invention

The present invention relates generally to methods for fabricating microelectronic fabrications. More particularly, the present invention relates to methods for fabricating high areal density patterned microelectronic structures within microelectronic fabrications.

2. Description of the Related Art

Microelectronic fabrications are formed in part from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly more difficult within the art of microelectronic fabrication to fabricate within microelectronic fabrications patterned microelectronic structures with enhanced areal density. Particularly difficult within the art of microelectronic fabrication to fabricate with enhanced areal density, in particular while maintaining comparatively high levels of areal capacitance, are microelectronic structures employed within microelectronic capacitors employed within dynamic random access memory (DRAM) cells employed within semiconductor integrated circuit microelectronic fabrications.

It is thus towards the goal of forming within the art of microelectronic fabrication patterned microelectronic structures, such as but not limited to patterned microelectronic structures which are employed within microelectronic capacitors employed within dynamic random access memory (DRAM) cells within semiconductor integrated circuit microelectronic fabrications, with enhanced areal density, that the present invention is directed.

Various methods have been disclosed within the art of microelectronic fabrication for forming patterned microelectronic structures with desirable properties within the art of microelectronic fabrication.

For example, Koh, in U.S. Pat. No. 5,364,813, discloses a method for forming from a blanket polysilicon capacitor plate layer for use within a semiconductor integrated circuit microelectronic fabrication a patterned polysilicon capacitor plate layer for use within a polysilicon capacitor for use within the semiconductor integrated circuit microelectronic fabrication, while avoiding the formation of polysilicon etch residues when forming from the blanket polysilicon capacitor plate layer the patterned polysilicon capacitor plate layer. To realize the foregoing object, the method employs an in-situ oxidation of an unneeded portion of the blanket polysilicon capacitor plate layer from which is formed the patterned polysilicon capacitor plate layer, to form therefrom a silicon oxide dielectric layer, rather than an etch patterning of the blanket polysilicon capacitor plate layer when forming the patterned polysilicon capacitor plate layer.

In addition, Wu, in U.S. Pat. No. 5,650,351, discloses a method for forming, for use within a microelectronic fabrication, a microelectronic capacitor, such as a microelectronic capacitor employed within a dynamic random access memory (DRAM) cell, wherein a patterned capacitor plate layer within the microelectronic capacitor has multiple pillars which provide for an enhanced areal capacitance of the microelectronic capacitor. To realize the foregoing object, the method employs an oxidized hemispherical grain silicon (HSG) layer as a masking layer when forming the patterned capacitor plate layer within the microelectronic capacitor.

Further, Lien et al., in U.S. Pat. No. 6,022,776, discloses a method for forming within a semiconductor integrated circuit microelectronic fabrication a plurality of contact vias of varying depths through a series of dielectric layers of varying thicknesses, while avoiding when forming the plurality of contact vias overetching into a semiconductor substrate which is employed for forming the semiconductor integrated circuit microelectronic fabrication. To realize the foregoing object, the method employs a silicon oxynitride etch stop layer formed upon the semiconductor 5 substrate at the location of a series of deeper contact vias, such that there is avoided at the location of the series of deeper contact vias overetching into the semiconductor substrate when forming the plurality of contact vias through the series of dielectric layers.

Still further, Chien et al., in U.S. Pat. No. 6,030,867, discloses a method for forming, with enhanced areal capacitance, a microelectronic capacitor for use within a dynamic random access memory (DRAM) cell within a semiconductor integrated circuit microelectronic fabrication. To realize the foregoing object, the method employs, in conjunction with other features, a hemispherical grain silicon (HSG) layer as an etch mask layer when forming a patterned capacitor plate layer within the microelectronic capacitor.

Finally, Jeng et al., in U.S. Pat. No. 6,037,211, discloses a method for forming through a dielectric layer within a semiconductor integrated circuit microelectronic fabrication a contact via having a high aspect ratio, where the contact via having the high aspect ratio is formed with an enhanced process margin. In order to realize the foregoing object, the method employs a multiple etch method which in part is a self-aligned etch method, when forming the contact via having the high aspect ratio.

Desirable in the art of microelectronic fabrication are additional methods and materials which may be employed for forming within microelectronic fabrications patterned microelectronic structures, such as but not limited to patterned microelectronic structures which are employed within microelectronic capacitors employed within dynamic random access memory (DRAM) cells, with enhanced areal density.

It is towards the foregoing object that the present invention is directed.

SUMMARY OF THE INVENTION

A first object of the present invention is to provide a method for forming a microelectronic structure within a microelectronic fabrication.

A second object of the present invention is to provide a method in accord with the first object of the present invention, wherein the microelectronic structure is formed with enhanced areal density.

A third object of the present invention is to provide a method in accord with the first object of the present invention or the second object of the present invention, which method is readily commercially implemented.

In accord with the objects of the present invention, there is provided by the present invention a method for forming a patterned layer within a microelectronic fabrication. To practice the method of the present invention, there is first provided a topographic substrate. There is then formed conformally over the topographic substrate a blanket target layer formed of a target material, where the blanket target layer has a lower substantially horizontal portion, an upper substantially horizontal portion and an intermediate portion therebetween. There is then formed upon the lower substantially horizontal portion of the blanket target layer a first masking layer formed of a first masking material and formed upon the upper substantially horizontal portion of the blanket target layer a second masking layer formed of a second masking material. There is then etched, while employing an etch method having an enhanced sequential selectivity for the first masking material and the target material with respect to the second masking material the first masking layer and the lower substantially horizontal portion of the blanket target layer to form a patterned target layer which leaves exposed a portion of the substrate beneath the lower horizontal portion of the blanket target layer while leaving unetched the upper substantially horizontal portion of the blanket target layer.

Within the method of the present invention, at least one of the first masking layer and the second masking layer is preferably formed in a self-aligned fashion absent a direct photolithographic definition of the first masking layer or the second masking layer.

The present invention provides a method for forming a microelectronic structure within a microelectronic fabrication, wherein the microelectronic structure is formed with enhanced areal density. The present invention realizes the foregoing objects by employing a plurality of masking layers when forming over a topographic substrate within a microelectronic fabrication from a conformal blanket target layer within the microelectronic fabrication a patterned target layer which may be employed within a microelectronic structure within the microelectronic fabrication. In particular, the present invention also realizes the foregoing objects by preferably forming at least one of the plurality of masking layers in a self aligned fashion, absent direct photolithographic definition.

The method of the present invention is readily commercially implemented. The present invention employs methods and materials as are generally known in the art of microelectronic fabrication, but employed within the context of a specific ordering and process control to provide the present invention. Since it is thus a process control and materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a microelectronic structure within a microelectronic fabrication, wherein the microelectronic structure is formed with enhanced areal density. The present invention realizes the foregoing objects by employing a plurality of masking layers when forming over a topographic substrate within a microelectronic fabrication from a conformal blanket target layer within the microelectronic fabrication a patterned target layer which may be employed within a microelectronic structure within the microelectronic fabrication. In particular, the present invention also realizes the foregoing objects by preferably forming at least one of the plurality of masking layers in a self aligned fashion, absent direct photolithographic definition.

First Preferred Embodiment

Figure 1:
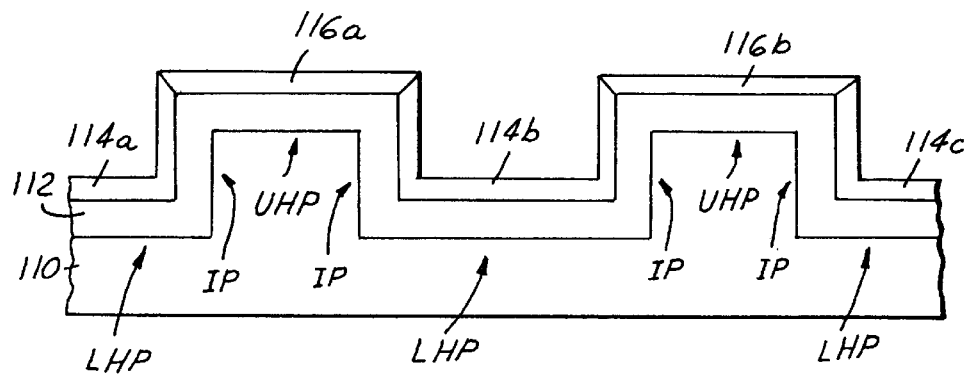
FIG. 1 and FIG. 2 show a pair of schematic cross-sectional diagrams illustrating the results of forming, in accord with a general embodiment of the present invention which comprises a first preferred embodiment of the present invention, a pair of patterned target layers within a microelectronic fabrication.
Figure 2:
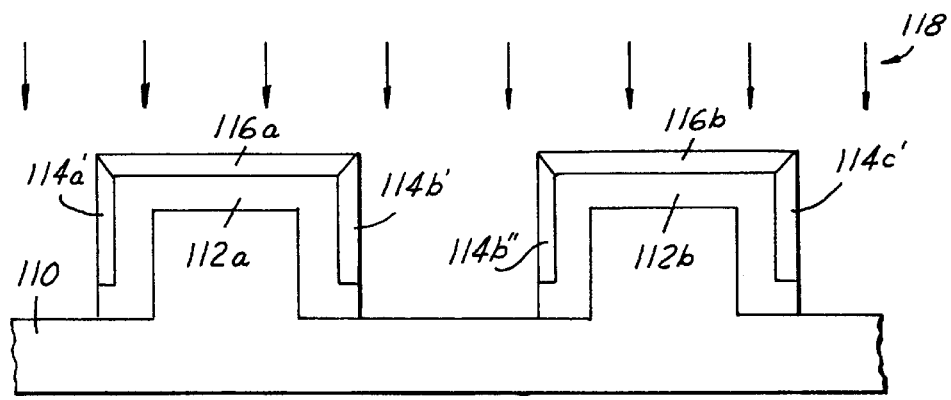

Referring now to FIG. 1 and FIG. 2, there is shown a pair of schematic cross-sectional diagrams illustrating the results of forming, in accord with a general embodiment of the invention which comprises a first preferred embodiment of the present invention, a pair of patterned target layers within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 in a first instance is a topographic substrate 110 having formed conformally thereupon and thereover a blanket target layer 112, in turn having formed conformally thereupon and thereover a series of patterned first masking layers 114a, 114b and 114c laterally contiguous with a pair of patterned second masking layers 116a and 116b.

Within the first preferred embodiment of the present invention with respect to the topographic substrate 110, the topographic substrate 110 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the topographic substrate 110 may consist of a substrate alone as employed within the microelectronic fabrication, or in an alternative, the topographic substrate 110 may comprise the substrate as employed within the microelectronic fabrication, where the substrate has formed thereupon and/or thereover any of several additional microelectronic layers as are conventional within the microelectronic fabrication within which is employed the topographic substrate 110. Similarly with the substrate alone as employed within the microelectronic fabrication, such additional microelectronic layers may be formed from microelectronic materials including but not limited to microelectronic conductor materials, microelectronic semiconductor materials and microelectronic dielectric materials.

Similarly, although also not specifically illustrated within the schematic cross-sectional diagram of FIG. 1, the topographic substrate 110, typically and preferably, but not exclusively, when the topographic substrate 110 comprises a semiconductor substrate employed within a semiconductor integrated circuit microelectronic fabrication, has formed therein and/or thereupon microelectronic devices as are conventional within the microelectronic fabrication within which is employed the topographic substrate 110. Such microelectronic devices may be selected from the group including but not limited to resistors, transistors, diodes and capacitors.

Typically and preferably, within the first preferred embodiment of the present invention, the topographic substrate 110 will have topographic features (i.e., mesas and trenches) of bidirectional linewidth from about 0.22 to about 10 microns and depth from about 10,000 to about 20,000 angstroms.

Within the first preferred embodiment of the present invention with respect to the blanket target layer 112, the blanket target layer 112 may be formed of target materials as are conventional in the art of microelectronic fabrication, such target materials being selected from the group including but not limited to conductor target materials, semiconductor target materials and dielectric target materials. As is similarly illustrated within the schematic cross-sectional diagram of FIG. 1, the blanket target layer 112 has: (1) a series of lower substantially horizontal portions LHP of the blanket target layer 112 as formed upon and over the topographic substrate 110; (2) a pair of upper substantially horizontal portions UHP of the blanket target layer 112 as formed upon and over the topographic substrate 110; and a series of intermediate portions IP of the patterned target layer 112 formed interposed between the series of lower substantially horizontal portions LHP of the blanket target layer 112 and the pair of upper substantial horizontal portions UHP of the blanket target layer 112. Within the context of the present invention and the preferred embodiments of the present invention the terminology "substantially horizontal" is intended to indicate a deviation of the surface of a blanket target layer, such as the blanket target layer 112, of no more than about 10 degrees from a major plane of a topographic substrate, such as the topographic substrate 110.

Typically and preferably, the blanket target layer 112 is formed to a thickness of from about 500 to about 1,500 angstroms upon and over the topographic substrate 110.

Within the first preferred embodiment of the present invention with respect to the series of patterned first masking layers 114a, 114b and 114c which are formed in part upon and over the series of lower substantially horizontal portions LHP of the blanket target layer 112, and also formed bridging to laterally cover the series of intermediate portions IP of the blanket target layer 112, in conjunction with the pair of patterned second masking layers 116a and 116b formed upon and over the pair of upper substantially horizontal portions UHP of the blanket target layer 112, the series of patterned first masking layers 114a, 114b and 114c is formed of a first masking material, the pair of patterned second masking layers 116a and 116b is formed of a second masking material and the blanket target layer 112 is formed of a target material, such that within a sequential etch method (typically and preferably a sequential anisotropic plasma etch method) employed for forming in part a pair of patterned target layers from the blanket target layer 112 there is exhibited an enhanced selectivity for both the first masking material and the target material with respect to the second masking material. Within the first preferred embodiment of the present invention, both the first masking material and the second masking material may be selected from the group of masking materials including but not limited to conductor masking materials, semiconductor masking materials and dielectric masking materials.

Similarly, within the sequential isotropic etch method for forming the pair of patterned target layers from the blanket target layer 112, the portions of the patterned first masking layers 114a, 114b and 114c formed covering and adjoining the intermediate portions IP of the blanket target layer 112 are typically and preferably formed of a sufficient thickness such as to provide a protective barrier when etching the blanket target layer 112 to form the pair of patterned target layers.

Finally, although not specifically illustrated within the schematic cross-sectional diagram of FIG. 1, but as will be illustrated in greater detail within the second preferred embodiment of the present invention which follows, at least one of: (1) the series of patterned first masking layers 114a, 114b and 114c; and (2) the pair of patterned second masking layers 116a and 116b, is formed in a self aligned fashion, without employing a photolithographic method for definition of the series of patterned first masking layers 114a, 114b, and 114b or the pair of patterned second masking layers 116a and 116b, such that the pair of patterned target layers is defined by a lateral topography of the topographic substrate 110. Under such circumstances, the pair of patterned target layers may be formed with enhanced areal density insofar as there is avoided within the present invention and the preferred embodiments of the present invention a need to accommodate for a registration tolerance from a photolithographic method which might otherwise be employed for forming the patterned target layers from the blanket target layer 112.

Typically and preferably, each of the series of patterned first masking layers 114a, 114b and 114c is formed to a thickness of from about 50 to about 200 angstroms and each of the pair of patterned second masking layers 116a and 116d laterally contiguous therewith is formed to a thickness of from about 100 to about 250 angstroms.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein: (1) the series of patterned first masking layers 114a, 114b and 114c has been etched to form a series of etched patterned first masking layers 114a', 114b', 114b'' and 114c'; and (2) the blanket target layer 112 has been etched to form a pair of patterned target layers 112a and 112b, while employing an etching plasma 118 which, as noted above, is typically and preferably an anisotropic sequential etching plasma which is selective for the first masking material from which is formed the series of patterned first masking layers 114a, 114b and 114c, and the target material from which is formed the blanket target layer 112 with respect to the second masking material from which is formed the pair of patterned second masking layers 116a and 116b.

Upon forming the microelectronic fabrication of the first preferred embodiment of the present invention as illustrated within the schematic cross-sectional diagram of FIG. 2, there is formed a microelectronic fabrication having formed therein a pair of patterned target layers 112a and 112b which may be formed with enhanced areal density insofar as the pair of patterned target layers 112a and 112b is formed employing a self-aligned masking method absent a photolithographic process step for directly defining the pair of patterned target layers 112a and 112b.

Second Preferred Embodiment

Referring now to FIG. 3 to FIG. 9, there is shown a series of schematic cross-sectional diagrams illustrating the results of forming, in accord with a more specific embodiment of the present invention which comprises a second preferred embodiment of the present invention, a pair of patterned polysilicon capacitor plate layers within a pair of polysilicon capacitors within a semiconductor integrated circuit microelectronic fabrication.

Figure 3:
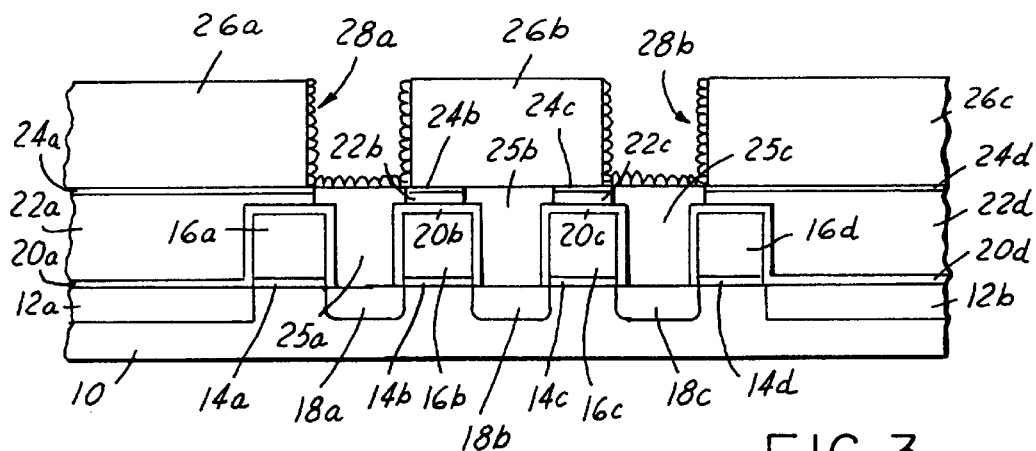
FIG. 3, FIG. 4, FIG. 5, FIG. 6, FIG. 7, FIG. 8 and FIG. 9 show a series of schematic cross-sectional diagrams illustrating the results of forming, in accord with a more specific embodiment of the present invention which comprises a second preferred embodiment of the present invention, a pair of patterned polysilicon capacitor plate layers within a pair of polysilicon capacitors within a semiconductor integrated circuit microelectronic fabrication.

Shown in FIG. 3 is a schematic cross-sectional diagram of the semiconductor integrated circuit microelectronic fabrication at an early stage in its fabrication in accord with the second preferred embodiment of the present invention.

Shown in FIG. 3, in a first instance, is a semiconductor substrate 10 having formed therein and thereupon a pair of isolation regions 12a and 12b which defines an active region of the semiconductor substrate 10. Similarly, there is also shown within the schematic cross-sectional diagram of FIG. 1, and formed upon the active region of the semiconductor substrate 10, a series of gate dielectric layers 14a, 14b, 14c and 14d having formed and aligned thereupon a series of gate electrodes 16a, 16b, 16c and 16d, where the series of gate dielectric layers 14a, 14b, 14c and 14d having formed aligned thereupon the series of gate electrodes 16a, 16b, 16c and 16d defines within the active region of the semiconductor substrate 10 the locations of a series of source/drain regions 18a, 18b and 18c.

Within the second preferred embodiment of the present invention each of the semiconductor substrate 10, the pair of isolation regions 12a and 12b, the series of gate dielectric layers 14a, 14b, 14b, 14c and 14d, the series of gate electrodes 16a, 16b, 16c and 16d, as well as the series of source/drain regions 18a, 18b and 18c, may be formed employing methods, materials, dimensions and doping levels as are otherwise conventional in the art of semiconductor integrated circuit microelectronic fabrication.

Shown also within FIG. 3, formed at least in part passivating the series of gate electrodes 16a, 16b, 16c and 16d is a series of patterned dielectric liner layers 20a, 20b, 20c and 20d having formed thereupon a series of patterned interpolysilicon dielectric (IPD) layers 22a, 22b, 22c and 22d, further in turn having formed thereupon a series of patterned dielectric cap layers 24a, 24b, 24c and 24d. Within the second preferred embodiment of the present invention, the series of patterned dielectric liner layers 20a, 20b, 20c and 20d, as well as the series of patterned dielectric cap layers 24a, 24b, 24c and 24d is typically and preferably formed of a dense dielectric material, such as but not limited to a dense silicon oxide dielectric material, a dense silicon nitride dielectric material or a dense silicon oxynitride dielectric material, while in comparison, the series of patterned interpolysilicon dielectric (IPD) layers 22a, 22b, 22c and 22d is typically and preferably formed of a less dense dielectric material, and often a lower dielectric constant dielectric material, such as but not limited to a less dense and lower dielectric constant silicon oxide dielectric material.

There is also shown within the schematic cross-sectional diagram of FIG. 3 formed into a series of apertures defined in part by the series of gate electrodes 16a, 16b, 16c and 16d a series of conductor stud layers 25a, 25b and 25c which contacts the corresponding series of source/drain regions 18a, 18b and 18c while simultaneously being isolated from the series of gate electrodes 16a, 16b, 16c and 16d by the series of patterned dielectric liner layers 20a, 20b, 20c and 20d. Within the second preferred embodiment of the present invention, the series of conductor stud layers 25a, 25b and 25c is typically and preferably formed of a conductive polysilicon material (having a dopant concentration of from about $10^{19}$ to about $10^{21}$ dopant atoms per cubic centimeter), although other conductive materials, such as but not limited to conductive tungsten materials, may also be employed for forming the series of conductor stud layers 25a, 25b and 25c.

Finally, there is shown in the schematic cross-sectional diagram of FIG. 3 a series of patterned node dielectric layers 26a, 26b and 26c having formed within a pair of apertures which are defined by the series of patterned node dielectric layers 26a, 26b and 26c a pair of patterned capacitor node layers 28a and 28b which contact the corresponding pair of conductor stud layers 25a and 25c.

Within the second preferred embodiment of the present invention with respect to the series of patterned node dielectric layers 26a, 26b and 26c, the series of patterned node dielectric layers 26a, 26b and 26c is typically and preferably formed employing a silicon oxide node dielectric material as is conventional in the art of microelectronic fabrication. Typically and preferably, each of the patterned node dielectric layers 26a, 26b and 26c is formed to a thickness of from about 10,000 to about 15,000 angstroms.

Finally, within the second preferred embodiment of the present invention with respect to the pair of patterned capacitor node layers 28a and 28b, the pair of patterned capacitor node layers 28a and 28b is typically and preferably formed of a hemispherical grain silicon (HSG) material as is generally conventional in the art of microelectronic fabrication, where methods for forming such hemispherical grain silicon (HSG) materials are disclosed in greater detail within the references within the Description of the Related Art, the disclosures from all of which references within the Description of the Related Art are incorporated herein fully by reference.

Within the second preferred embodiment of the present invention in order to form the pair of patterned capacitor node layers 28a and 28b, there is first typically and preferably deposited a blanket hemispherical grain silicon (HSG) layer upon the semiconductor integrated circuit microelectronic fabrication whose schematic cross-sectional diagram is illustrated in FIG. 3 absent the pair of patterned capacitor node layers 28a and 28b. There is then also typically and preferably coated the resulting semiconductor integrated circuit microelectronic fabrication with a blanket photoresist layer or blanket encapsulating layer, which blanket photoresist layer or blanket encapsulating layer is etched back to reveal a series of upper lying horizontal portions of the blanket hemispherical grain silicon (HSG) layer. The series of upper lying horizontal portions of the blanket hemispherical grain silicon (HSG) layer are then polished to leave remaining within the pair of apertures defined by the series of patterned node dielectric layers 26a, 26b and 26c the pair of patterned capacitor node layers 28a and 28b having a corresponding pair of patterned photoresist residue layers or patterned encapsulating residue layers formed thereupon. Finally the pair of patterned photoresist residue layers or the pair of patterned encapsulating residue layers is stripped from the pair of patterned capacitor node layers 28a and 28b. Typically and preferably, the hemispherical grain silicon (HSG) material from which is formed the pair of patterned capacitor node layers 28a and 28b is formed to a thickness of from about 500 to about 1,500 angstroms.

Figure 4:
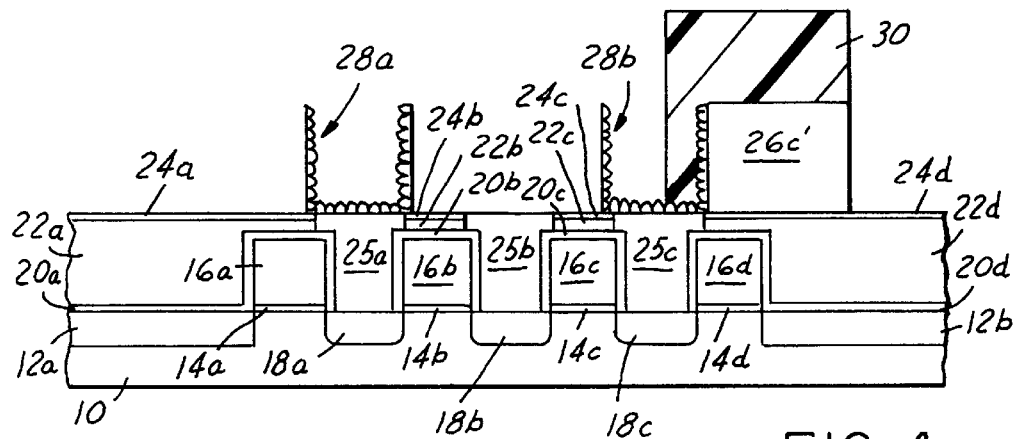

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there is formed partially overlapping the patterned node dielectric layer 26c a patterned first photoresist layer 30; and (2) the patterned node dielectric layer 26c is patterned to form an etched patterned node dielectric layer 26c', while simultaneously stripping from the semiconductor integrated circuit microelectronic fabrication the pair of patterned node dielectric layers 26a and 26b.

The semiconductor integrated circuit microelectronic fabrication whose schematic cross-sectional diagram is illustrated in FIG. 4 may be formed from the semiconductor integrated circuit microelectronic fabrication whose schematic cross-sectional diagram is illustrated in FIG. 3 while employing photolithographic and etch methods as are conventional in the art of semiconductor integrated circuit microelectronic fabrication.

Figure 5:
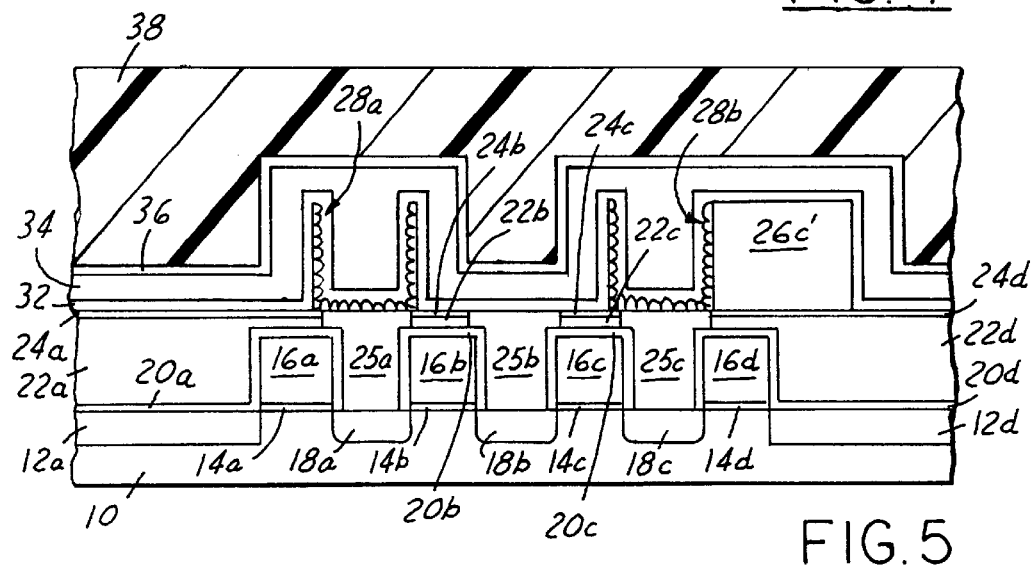

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein in a first instance there is stripped from the semiconductor integrated circuit microelectronic fabrication the patterned first photoresist layer 30. The patterned first photoresist layer 30 may be stripped from the semiconductor integrated circuit microelectronic fabrication whose schematic cross-sectional diagram is illustrated in FIG. 4 to provide in part the semiconductor integrated circuit microelectronic fabrication whose schematic cross-sectional diagram is illustrated in FIG. 5 while employing photoresist stripping methods as are conventional in the art of semiconductor integrated circuit microelectronic fabrication, such photoresist stripping methods including but not limited to wet chemical photoresist stripping methods and dry plasma photoresist stripping methods.

Similarly, there is also shown within the semiconductor integrated circuit microelectronic fabrication whose schematic cross-sectional diagram is illustrated in FIG. 5: (1) a blanket capacitor dielectric layer 32 formed encapsulating the pair of patterned capacitor node layers 28a and 28b and bridging to cover the series of patterned dielectric cap layers 24a, 24b, 24c and 24d; (2) a blanket capacitor plate layer 34 formed upon the blanket capacitor dielectric layer 32; (3) a blanket first masking layer 36 formed upon the blanket capacitor plate layer 34; and (4) a blanket second photoresist layer 38 formed upon the blanket first masking layer 36.

Within the second preferred embodiment of the present invention, each of the foregoing blanket layers may be formed employing methods and materials as are conventional in the art of microelectronic fabrication. Typically and preferably, the blanket capacitor dielectric layer 32 is formed of a composite of a silicon nitride layer of thickness from about 40 to about 60 angstroms formed in part upon the pair of patterned capacitor node layers 28a and 28b, where the blanket silicon nitride layer in turn has formed thereupon a blanket silicon oxide layer of thickness from about 10 to about 20 angstroms. Similarly, typically and preferably, the blanket capacitor plate layer 34 is formed of a doped polysilicon material formed to a thickness of from about 500 to about 1,500 angstroms upon the blanket capacitor dielectric layer 32. Yet similarly, typically and preferably, the blanket first masking layer 36 is typically and preferably formed of a silicon nitride or silicon oxynitride dielectric masking material, formed to a thickness of from about 40 to about 80 angstroms upon the blanket capacitor plate layer 34. Finally, typically and preferably, the blanket second photoresist layer 38 is formed to a planarizing thickness of from about 7,000 to about 10,000 angstroms employing a photoresist material, or alternatively a planarizing material, as is conventional in the art of microelectronic fabrication.

Figure 6:
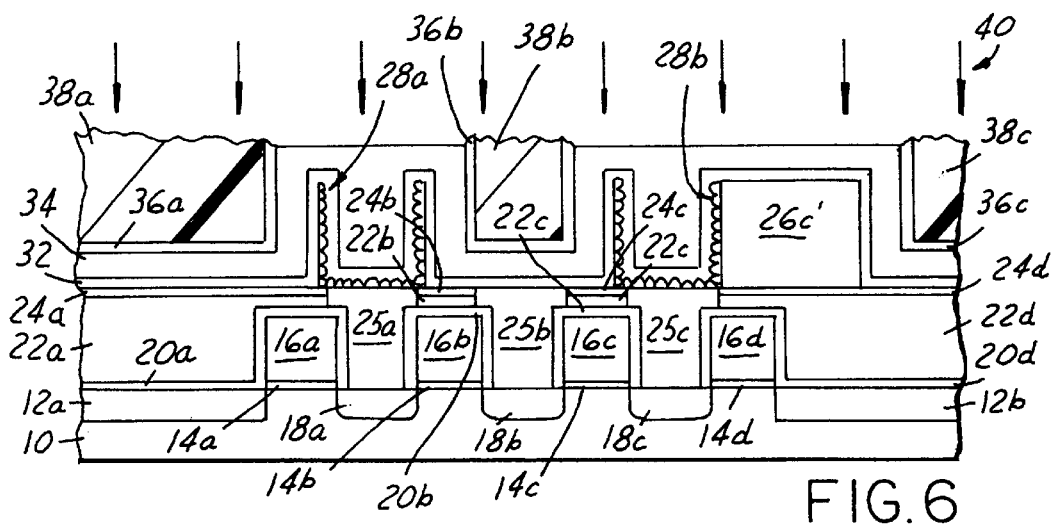

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the blanket second photoresist layer 38 has been etched back to form a series of patterned second photoresist layers 38a, 38b and 38c, while simultaneously etching the blanket first masking layer 36 to form a series of patterned first masking layers 36a, 36b and 36c, further while employing the blanket capacitor plate layer 34 as an etch stop layer, through use of an etchback plasma 40.

Within the second preferred embodiment of the present invention, the etchback plasma 40 employs an etchant gas composition which upon plasma activation forms a etchant species which preferably etches the blanket second photoresist layer 38 and the blanket first masking layer 36 at an approximately equivalent rate, but does not substantially etch the blanket capacitor plate layer 34. Within the second preferred embodiment of the present invention when the blanket first masking layer 36 is formed of a silicon nitride material or a silicon oxynitride material, such an etchant species may be derived from an etchant gas composition comprising $CHF_3$ and $CF_4$, in a flow rate ratio of from about 1:4 to about 1:5.

Figure 7:
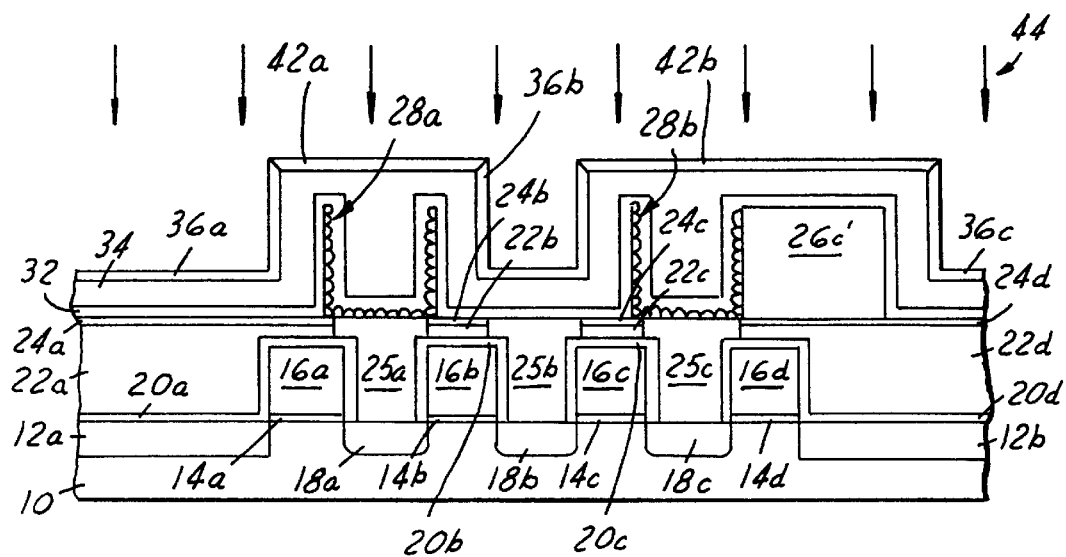

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, the patterned second photoresist layers 38a, 38b and 38c have been stripped from the semiconductor integrated circuit microelectronic fabrication.

The series of patterned second photoresist layers 38a, 38b and 38c may be stripped from the semiconductor integrated circuit microelectronic fabrication whose schematic cross-sectional diagram is illustrated in FIG. 6 to provide in part the semiconductor integrated circuit microelectronic fabrication whose schematic cross-sectional diagram is illustrated in FIG. 7 while employing photoresist striping methods as are conventional in the art of semiconductor integrated circuit microelectronic fabrication, such photoresist stripping methods including but not limited to wet chemical photoresist stripping methods and dry plasma photoresist stripping methods.

Also shown within the schematic cross-sectional diagram of FIG. 7 is the presence of a pair of patterned second masking layers 42a and 42b which are formed incident to thermal annealing of the semiconductor integrated circuit microelectronic fabrication whose schematic cross-sectional diagram is illustrated in FIG. 7 within a thermal annealing atmosphere 44. Within the second preferred embodiment of the present invention where the blanket capacitor plate layer 34 is formed of a doped polysilicon material, the pair of patterned second masking layers 42a and 42b will be formed in a self aligned fashion of a silicon oxide dielectric material, through partial and typically negligible consumption of the blanket capacitor plate layer 34. Typically and preferable the thermal annealing atmosphere 44 is maintained at a temperature of from about 650 to about 700 degrees centigrade for a time period of from about 5 to about 30 minutes to form the pair of patterned second masking layers 42a and 42b of silicon oxide of thickness from about 100 to about 200 angstroms.

Figure 8:
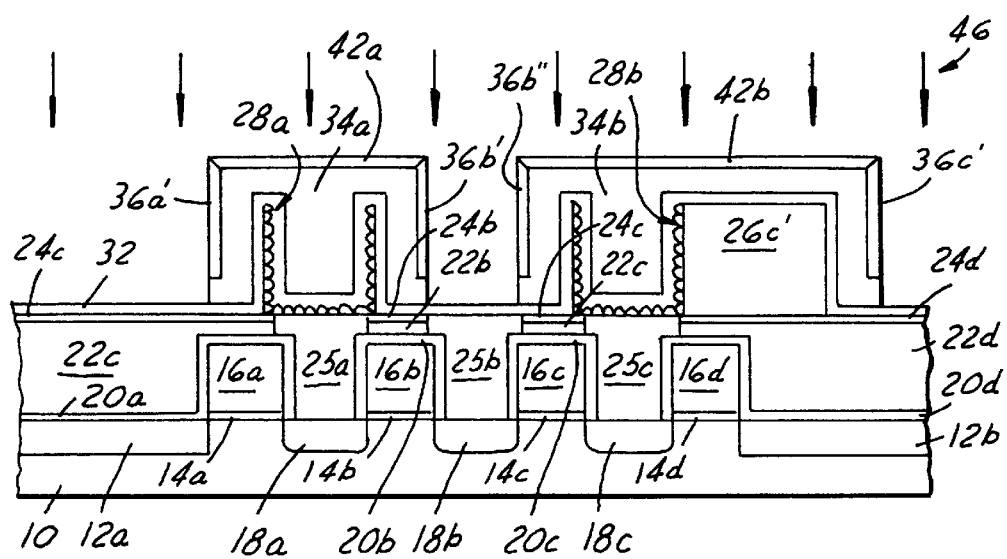

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein: (1) the series of patterned first masking layers 36a, 36b and 36c has been etched to form a series of etched patterned first masking layers 36a', 36b', 36b' and 36c'; and (2) the blanket capacitor plate layer 34 has been patterned to form a pair of patterned capacitor plate layers 34a and 34b, while employing the pair of patterned second masking layers 42a and 42b as a pair of etch mask layers, in conjunction with a second etching plasma 46.

Within the second preferred embodiment of the present invention: (1) the patterned first masking layers 36a, 36b and 36c are further etched to form the etched patterned first masking layers 36a', 36b', 36b'' and 36c'; and (2) the blanket capacitor plate layer 34 is etched to form the pair of patterned capacitor plate layers 34a and 34b, while employing a sequential plasma etch method employing a fluorine containing etchant gas composition followed by a chlorine containing etchant gas composition.

Figure 9:
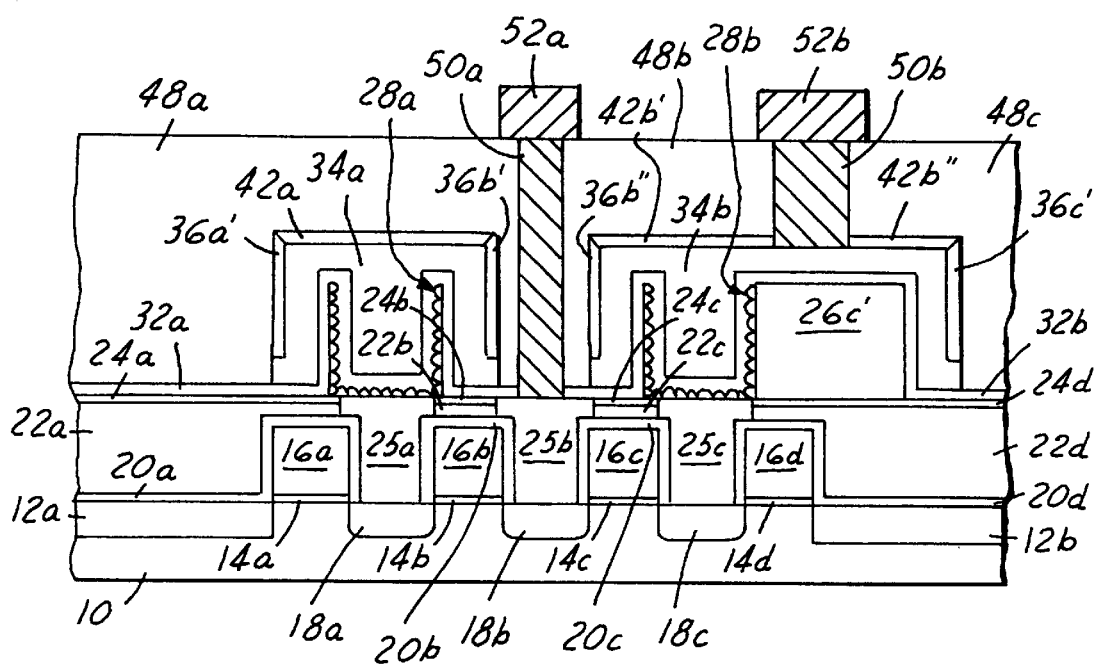

Referring finally to FIG. 9, there is shown a schematic cross-sectional diagram illustrating the resulte of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein, in a first instance, there is formed covering the semiconductor integrated circuit microelectronic fabrication a series of patterned pre-metal dielectric (PMD) layers 48a, 48b and 48c which define a pair of apertures, one aperture reaching the conductor stud layer 25b while forming a pair of patterned capacitor dielectric layers 32a and 32b from the blanket capacitor dielectric layer 32, and the other aperture reaching the patterned capacitor plate layer 34b. Such patterned pre-metal dielectric (PMD) layers may be formed employing methods as are conventional in the art of semiconductor integrated circuit microelectronic fabrication, and may typically and preferably be formed of a silicon oxide dielectric material, although other dielectric materials may also be employed. Typically and preferably, each of the patterned pre-metal dielectric (PMD) layers 48a, 48b and 48c is formed to a thickness of from about 6,000 to about 8,000 angstroms.

Finally, there is also shown within the schematic cross-sectional diagram of FIG. 9: (1) a pair of second conductor stud layers 50a and 50b formed into the pair of apertures defined by the series of patterned pre-metal dielectric (PMD) layers 48a, 48b and 48c; and (2) a pair of patterned first conductor layers 52a and 52b formed contacting the pair of second conductor stud layers 50a and 50b.

Within the second preferred embodiment of the present invention the pair of second conductor stud layers 50a and 50b, as well as the pair of patterned first conductor layers 52a and 52b, may be formed employing methods and materials as are conventional in the art of semiconductor integrated circuit microelectronic fabrication. Typically and preferably, the pair of patterned conductor stud layers 50a and 50b is formed of a conductor stud material such as but not limited to a doped polysilicon conductor stud material or a tungsten conductor stud material, formed to sufficient height to completely fill each of the pair of apertures defined by the series of patterned pre-metal dielectric (PMD) layers 48a, 48b and 48c. Typically and preferably, the pair of patterned conductor layers 52a and 52b is formed to a thickness of from about 4,000 to about 5,000 angstroms from a conductor material selected from the group including but not limited to aluminum conductor materials and copper conductor materials.

Upon forming the semiconductor integrated circuit microelectronic fabrication whose schematic cross-sectional diagram is illustrated in FIG. 9, there is formed a semiconductor integrated circuit microelectronic fabrication having formed therein a pair of microelectronic structures, and in particular a pair of upper patterned capacitor plate layers employed within a pair of polysilicon capacitors, formed with enhanced areal density. The pair of upper capacitor plate layers is formed with enhanced areal density insofar as they are formed employing a self-aligned method which employs a topography of a topographic substrate layer upon which they are formed, and which does not require a direct photolithographic definition of the pair of upper capacitor plate layers.

As is understood by a person skilled in the art, although the present invention may be employed when forming with enhanced areal density any of several microelectronic structures within a microelectronic fabrication, the present invention provides particular value within the context of the second preferred embodiment of the present invention, where patterned conductor layer 52a and second conductor stud layer 50a form a "bit line" ultimately accessing source/drain region 18b. Within such a capacitor under bit line fabrication of a semiconductor integrated circuit microelectronic fabrication, in comparison with a capacitor over bit line fabrication of a semiconductor integrated circuit microelectronic fabrication, available areal locations to position bit lines is particularly limited given areal requirements for capacitor plate layers.

As is similarly understood by a person skilled in the art, the preferred embodiments of the present invention are illustrative of the present invention rather than limiting of the present invention. Revisions and modifications may be made to methods, materials, structures and dimensions through which is fabricated a microelectronic fabrication in accord with the preferred embodiments of the present invention, while still providing a microelectronic fabrication in accord with the present invention, further in accord with the appended claims.

What is claimed is:

1. A method for forming a patterned layer comprising:

providing a topographic substrate;

forming conformally over the topographic substrate a blanket target layer formed of a target material, the blanket target layer having a lower substantially horizontal portion, an upper substantially horizontal portion and an intermediate portion therebetween;

forming upon the lower substantially horizontal portion of the blanket target layer a first masking layer formed of a first masking material and forming upon the upper substantially horizontal portion of the blanket target layer a second masking layer formed of a second masking material;

etching, while employing an etch method having an enhanced sequential selectivity for the first masking material and the target material with respect to the second masking material, the first masking layer and the lower substantially horizontal portion of the blanket target layer to form a patterned target layer which leaves exposed a portion of the substrate beneath the lower horizontal portion of the blanket target layer while leaving unetched the upper substantially horizontal portion of the blanket target layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the target material is selected from the group consisting of conductor target materials, semiconductor target materials and dielectric target materials.

4. The method of claim 1 wherein the blanket target layer is formed to a thickness of from about 500 to about 1,500 angstroms.

5. The method of claim 1 wherein the first masking material is selected from the group consisting of conductor masking materials, semiconductor masking materials and dielectric masking materials.

6. The method of claim 1 wherein the second masking material is selected from the group consisting of conductor masking materials, semiconductor masking materials and dielectric masking materials.

7. The method of claim 1 wherein:

the first masking layer is also formed laterally covering the intermediate portion of the blanket target layer; and the first masking layer is formed of a thickness which inhibits lateral etching of the blanket target layer within the etch method.

8. The method of claim 1 wherein at least one of the first masking layer and the second masking layer is formed in a self-aligned fashion.

9. A method for forming a capacitor plate layer comprising:

providing a topographic substrate;

forming conformally over the topographic substrate a blanket capacitor plate layer formed of a capacitor plate material, the blanket capacitor plate layer having a lower substantially horizontal portion, an upper substantially horizontal portion and an intermediate portion therebetween;

forming upon the lower substantially horizontal portion of the blanket capacitor plate layer a first masking layer formed of a first masking material and forming upon the upper substantially horizontal portion of the blanket capacitor plate layer a second masking layer formed of a second masking material;

etching, while employing an etch method having an enhanced sequential selectivity for the first masking material and the capacitor plate material with respect to the second masking material, the first masking layer and the lower substantially horizontal portion of the blanket capacitor plate layer to form a patterned capacitor plate layer which leaves exposed a portion of the substrate beneath the lower horizontal portion of the blanket capacitor plate layer while leaving unetched the upper substantially horizontal portion of the blanket capacitor plate layer.

10. The method of claim 9 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

11. The method of claim 9 wherein the capacitor plate material is formed of doped polysilicon.

12. The method of claim 9 wherein the blanket capacitor plate layer is formed to a thickness of from about 500 to about 1,500 angstroms.

13. The method of claim 9 wherein the first masking material is selected from the group consisting of silicon nitride materials and silicon oxynitride materials.

14. The method of claim 9 wherein the second masking material is a silicon oxide material.

15. The method of claim 9 wherein:

the first masking layer is also formed laterally covering the intermediate portion of the blanket capacitor plate layer; and the first masking layer is formed of a thickness which inhibits lateral etching of the blanket capacitor plate layer within the etch method.

16. The method of claim 9 wherein at least one of the first masking layer and the second masking layer is formed in a self-aligned fashion.

17. The method of claim 9 wherein the capacitor plate layer is employed within a capacitor employed within a dynamic random access memory (DRAM) cell.

* * * * *